United States Patent

Vegt

[11] Patent Number: 6,038,433
[45] Date of Patent: Mar. 14, 2000

[54] METHOD FOR AUTOMATICALLY SEARCHING A FREQUENCY RANGE FOR SIGNAL CHANNELS IN A RECEIVER FOR DIGITALLY MODULATED SIGNALS, AND RECEIVER FOR APPLYING SUCH A METHOD

[75] Inventor: Arjen Van Der Vegt, Utrecht, Netherlands

[73] Assignee: Irdeto B.V., Netherlands

[21] Appl. No.: 08/942,158

[22] Filed: Oct. 1, 1997

[30] Foreign Application Priority Data

Oct. 2, 1996 [EP] European Pat. Off. ............. 96202748

[51] Int. Cl.⁷ .................................................. H04Q 7/20
[52] U.S. Cl. ..................... 455/161.1; 455/161.2; 455/164.2; 455/164.1; 455/226.1
[58] Field of Search .................. 455/161.1, 161.2, 455/161.3, 164.1, 164.2, 165.1, 169.1, 226.1, 226.2; 375/261, 279, 280, 281, 329, 332, 340, 345; 370/252

[56] References Cited

U.S. PATENT DOCUMENTS

| | | | |
|---|---|---|---|
| 4,594,611 | 6/1986 | Sugibayashi et al. | 358/191.1 |
| 5,087,977 | 2/1992 | Suizi | 358/193.1 |
| 5,299,011 | 3/1994 | Choi | 348/731 |
| 5,303,400 | 4/1994 | Mogi | 455/161.3 X |
| 5,479,214 | 12/1995 | Sakakibara et al. | 348/558 |
| 5,621,767 | 4/1997 | Bradt et al. | 455/161.3 X |
| 5,640,696 | 6/1997 | Ishikawa et al. | 455/161.3 |
| 5,822,686 | 10/1998 | Lundberg et al. | 455/161.3 |

FOREIGN PATENT DOCUMENTS 60007221 1/1985 Japan.

*Primary Examiner*—Wellington Chin
*Assistant Examiner*—Yemane Woldetatios
*Attorney, Agent, or Firm*—Westman, Champlin & Kelly, P.A.; S. Koehler

[57] ABSTRACT

A method for automatically searching a frequency range for signal channels in a receiver for digitally modulated signals is described, each channel having a center frequency, a symbol rate, and a modulation type. The method comprises the steps of scanning the frequency range in first frequency steps corresponding with just less than half the minimum expected symbol rate of the channels, measuring the RF level at each frequency step and comparing the measured RF value with a threshold value, and, if the measured RF value is below the threshold value, continuing said scanning and measuring steps until the frequency range is fully scanned, and, if the measured RF value is above the threshold value, assuming the corresponding frequency as an indication of a digitally modulated signal channel and scanning a frequency area in second frequency steps to determine the edge frequencies of the channel, said second frequency steps being much smaller than said first frequency steps, determining the center frequency of the channel from said edge frequencies, and continuing said scanning and measuring steps for further signal channels until the frequency range is fully scanned.

6 Claims, 1 Drawing Sheet

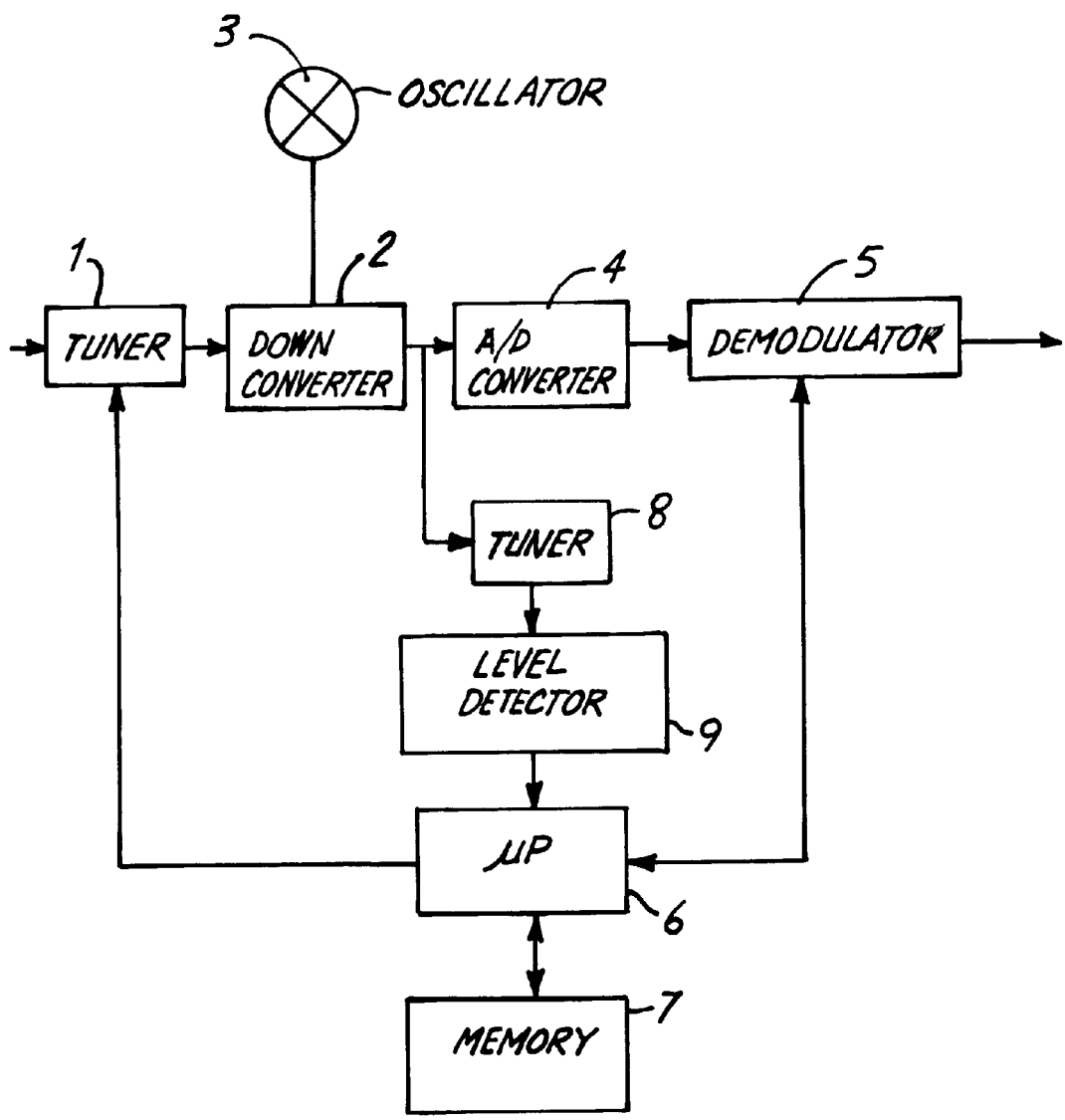

METHOD FOR AUTOMATICALLY SEARCHING A FREQUENCY RANGE FOR SIGNAL CHANNELS IN A RECEIVER FOR DIGITALLY MODULATED SIGNALS, AND RECEIVER FOR APPLYING SUCH A METHOD

BACKGROUND OF THE INVENTION

The present invention relates generally to an automatic channel scanning method and more specifically to a method for automatically searching a frequency range for signal channels in a receiver for digitally modulated signals, and to a receiver for applying such a method.

In a receiver for digitally modulated signals it is desirable to have a fast automatic method for finding the signal channels in a frequency range. However, to receive a signal, the center frequency of the channel, the symbol rate and the modulation type have to be known. In a conventional search method the receiver would try every possible combination of these values. The number of combinations is however immense and therefore this conventional procedure would take an unacceptably long time.

The present invention aims to provide an improved search method wherein the search time is considerably reduced.

SUMMARY OF THE INVENTION

According to the invention a method of the above-mentioned type is provided, said method comprising the steps of scanning the frequency range in first frequency steps corresponding with just less than half the minimum symbol rate of the channels that can be expected, measuring the RF level at each frequency step and comparing the measured RF value with a threshold value, and, if the measured RF value is below the threshold value, continuing said scanning and measuring steps until the frequency range is fully scanned, and, if the measured RF value is above the threshold value, assuming the corresponding frequency as an indication of a digitally modulated signal channel and scanning a frequency area in second frequency steps to determine the edge frequencies of the channel, said second frequency steps being much smaller than said first frequency steps, determining the center frequency of the channel from said edge frequencies, and continuing said scanning and measuring steps for further signal channels until the frequency range is fully scanned.

In this manner a method for automatically searching a frequency range for signal channels is obtained, wherein the frequency range can be scanned in a fast manner and wherein the step size of the first frequency steps is chosen in such a manner that on the one hand the steps are as great as possible and on the other hand a channel will never be skipped only when a channel is found the second frequency steps are used having such a step size that the bandwith of the channel can be determined with sufficient accuracy.

The invention further provides a receiver for signals digitally modulated on a center frequency of a channel, the receiver according to the invention comprising a tuner, a demodulator for demodulating digitally modulated signals, and a control unit for controlling the tuner and the demodulator, wherein a narrowband RF level detector is provided receiving an output signal from the tuner and providing a RF level indication to the control unit, wherein said control unit is adapted to control the tuner for scanning a frequency range in first and second frequency steps, said first frequency steps corresponding with just less than half the minimum symbol rate of the channels that can be expected and said second frequency steps being much smaller than said first frequency steps, said control unit being adapted to control the tuner first to scan a frequency range at said first frequency steps until the output of the RF level detector provides an indication of a digitally modulated channel at a frequency and then to scan a frequency area around this frequency at said second frequency steps to determine the edge frequencies of the channel, wherein the control unit determines the center frequency from the edge frequencies found.

The invention will be further explained by reference to the drawing in which an embodiment of the receiver according to the invention is schematically shown.

DETAILED DESCRIPTION OF A PREFERRED EMBODIMENT

Just by way of example and without any intention to limit the scope of the invention it is assumed that the receiver shown is part of a so-called integrated receiver decoder receiving DVB (Digital Video Broadcasting) signals from a cable network or a satellite antenna. The receiver shown comprises a RF tuner 1 receiving DVB signals at its input. These signals are digitally modulated signals. The receiver further comprises a down converter 2 with oscillator 3 for converting the output signal of the tuner 1 to a baseband for further processing by an analog/digital converter 4 and a digital demodulator 5. A microprocessor 6 is provided as a micro controller for controlling the tuner 1 and demodulator 5. Further a memory 7 is provided for storing tuning information for the different channels present in the frequency range of DVB signals received. To recive a specific signal channel in the correct manner, the microprocessor 6 has to know the center frequency of the channel, the symbol rate and the modulation type. For DVB signals the frequency range is 47–862 MHz, the symbol rate is 1–7 MS/s and the modulation type can for example be QPSK, 16, 32, 64, 128 or 256 QAM. Although in theory it would be possible to manually enter this data for all channels available, this would be very cumbersome for the consumers. In view of the immense number of combinations, a straight forward search method would take an unacceptably long time.

The present invention provides a method for automatically searching a frequency range which is applied in the receiver shown and which considerably reduces the required search time. For applying the method described, the receiver is provided with a narrowband RF filter 8 receiving the output signal of the tuner 1 after being converted to the baseband by the converter 2. The filter 8 is connected to a RF level detector 9 and the output of the detector 9 is provided to the microprocessor 6.

When the receiver is installed for the first time or connected to a new cable network or channels have been changed in the cable network, new tuning information has to be stored in the memory 7. In some cases, it is possible for the consumer to enter the required tuning data for a home channel whereafter, when the receiver is tuned to this channel, the tuning data for the other channels in the network can be found in the so-called network information table (NIT). However, DVB channels in a cable network that are transmodulated from satellite only have a valid NIT if the satellite delivery system descriptors are replaced by cable delivery systems descriptors. Such a replacement of system descriptors is not always carried out. Therefore the receiver should be able to obtain the required tuning data by scanning the frequency range in a fast and efficient manner.

For this purpose the microprocessor 6 starts scanning the frequency range in first frequency steps corresponding with just less than half the minimum symbol rate of the channels that can be expected. In the present example with a symbol rate of 1–7 MS/s, this means scanning the frequency range from 47 MHz to 862 MHz in the first frequency steps of 500 kHz. At each frequency step the microprocessor 6 measures the RF value at the output of level detector 9 and if the measured RF value is higher than a predetermined threshold value and preferably is within a small range of for example 6 dB of the previous RF value, the approximate position of the center frequency of a channel is found. This means that the frequency corresponding with the measured RF value is assumed to be an indication of a digitally modulated signal.

Then the microprocessor 6 switches to scanning the frequency area around the assumed center frequency in second frequency steps suitable for finding tuning, i.e. steps much smaller than the first frequency steps, for example steps of 62,5 kHz. In this manner the microprocessor 6 determines the frequency at both edges of the channel. When these edge frequencies $f_1$ and $f_2$ have been found, the actual center frequency can be estimated by calculating $(f_1+f_2)/2$. Further the microprocessor 6 can estimate the symbol rate from the bandwidth of the channel as the symbol rate is related to the bandwidth according to the formula:

$$\text{bandwidth } (f_2-f_1) = \text{symbol rate} * (1+\alpha)$$

wherein $\alpha$ is the roll-off factor of the filter 8, which is normally 15%.

Thereafter the microprocessor 6 controls demodulator 5 to try to lock on the channel found by trying only different modulation types and perhaps a few symbol rates around the value estimated from the bandwidth of the signal. As soon as the demodulator 5 provides an indication to the microprocessor 6 that it has locked on the channel found, the corresponding information can be stored in the memory 7 for future use.

Then the microprocessor continues to scan the remaining frequency range at the first frequency steps for further channels. Of course, scanning the frequency range at the first frequency steps is also continued as long as the RF level measured at each frequency step is below the threshold value.

From the foregoing it will be clear that the invention provides a fast and efficient scanning method and receiver for applying this method, wherein the frequency range of interest is first scanned at frequency steps which are as large as possible while guaranteeing that a channel will not be skipped. Only when a channel indication is found a fine scanning takes place to determine the bandwith of the channel and thereby the symbol rate and then a modulation type is determined by trial and error.

It will be understood that the receiver described and shown in the drawing is just given by way of example only without limiting the scope of the invention to this type of receiver. It is for example possible to apply the invention in a receiver wherein a down converter and oscillator are not used.

The invention is not restricted to the above descripted embodiment which can be varied in a number of ways within the scope of the claims.

I claim:

1. Method for automatically searching a frequency range for signal channels in a receiver for digitally modulated signals, each channel having a center frequency, a symbol rate, and a modulation type, the method comprising the steps of scanning the frequency range in first frequency steps corresponding with just less than half the minimum symbol rate of the channels that can be expected, measuring the RF level at each frequency step and comparing the measured RF value with a threshold value, and, if the measured RF value is below the threshold value, continuing said scanning and measuring steps until the frequency range is fully scanned, and, if the measured RF value is above the threshold value, assuming the corresponding frequency as an indication of a digitally modulated signal channel and scanning a frequency area in second frequency steps to determine the edge frequencies of the channel, said second frequency steps being much smaller than said first frequency steps, determining the center frequency of the channel from said edge frequencies, and continuing said scanning and measuring steps for further signal channels until the frequency range is fully scanned.

2. Method according to claim 1, wherein, if the measured RF value is above the threshold value, the RF value is compared with the previous RF value, wherein the corresponding frequency is only assumed to be an indication of a digitally modulated channel if the RF value is within a predetermined range from the previous value.

3. Method according to claim 1, wherein the symbol rate is determined from the edge freqencies of the channel and wherein the modulation type is determined by trial and error.

4. Receiver for signals digitally modulated on a center frequency of a channel according to a modulation type and symbol rate, the receiver comprising a tuner, a demodulator for demodulating digitally modulated signals, and a control unit for controlling the tuner and the demodulator, wherein a narrowband RF level detector is provided receiving an output signal from the tuner and providing a RF level indication to the control unit, wherein said control unit is adapted to control the tuner for scanning a frequency range in first and second frequency steps, said first frequency steps corresponding with just less than half the minimum symbol rate of the channels that can be expected and said second frequency steps being much smaller than said first frequency steps, said control unit being adapted to control the tuner first to scan a frequency range at said first frequency steps until the output of the RF level detector provides an indication of a digitally modulated channel at a frequency and then to scan a frequency area around this frequency at said second frequency steps to determine the edge frequencies of the channel, wherein the control unit determines the center frequency from the edge frequencies found.

5. Receiver according to claim 4, wherein the control unit is adapted to compare the output value of the RF level detector with a predetermined threshold value, wherein this output value is further compared with the previous output value and the corresponding frequency is taken as indication of a digitally modulated channel if the output value is within a predetermined range from the previous output value.

6. Receiver according to claim 4, wherein the control unit determines the symbol rate of a channel from the edge frequencies.

* * * * *

UNITED STATES PATENT AND TRADEMARK OFFICE
CERTIFICATE OF CORRECTION

PATENT NO. : 6,038,433
DATED      : Mar. 14, 2000
INVENTOR(S) : Vegt

It is certified that error appears in the above-identified patent and that said Letters Patent is hereby corrected as shown below:

On the title page item,
    [30]    Foreign Application Priority Data

After Oct. 2, 1996 [EP] European Pat. Off.......
    replace "96202748" with --96202748.8--.

Signed and Sealed this

Twentieth Day of February, 2001

Attest:

NICHOLAS P. GODICI

Attesting Officer    Acting Director of the United States Patent and Trademark Office